(12) United States Patent
Mauritzson

(10) Patent No.: US 7,459,668 B2
(45) Date of Patent: Dec. 2, 2008

(54) METHOD, APPARATUS, AND SYSTEM TO REDUCE GROUND RESISTANCE IN A PIXEL ARRAY

(75) Inventor: Richard A. Mauritzson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/714,561

(22) Filed: Mar. 6, 2007

(65) Prior Publication Data

US 2008/0217718 A1 Sep. 11, 2008

(51) Int. Cl.
*H01L 27/146* (2006.01)
*H01L 31/00* (2006.01)

(52) U.S. Cl. ............... 250/214.1; 257/291; 257/431

(58) Field of Classification Search ............ 250/214.1; 257/290–293, 431, 342
See application file for complete search history.

(56) References Cited

U.S. PATENT DOCUMENTS

| | | | |
|---|---|---|---|
| 5,877,521 A | 3/1999 | Johnson et al. | |
| 6,326,652 B1 | 12/2001 | Rhodes | |
| 6,423,973 B2 * | 7/2002 | Choo et al. | 250/370.09 |
| 6,897,082 B2 | 5/2005 | Rhodes et al. | |
| 7,002,231 B2 | 2/2006 | Rhodes et al. | |
| 7,009,227 B2 | 3/2006 | Patrick et al. | |
| 7,037,764 B2 | 5/2006 | McClure | |
| 7,091,059 B2 | 8/2006 | Rhodes | |
| 7,091,536 B2 | 8/2006 | Rhodes et al. | |
| 7,102,180 B2 | 9/2006 | Rhodes et al. | |
| 2001/0013577 A1 * | 8/2001 | Choo et al. | 250/370.09 |
| 2004/0262646 A1 * | 12/2004 | Patrick et al. | 257/233 |
| 2006/0043393 A1 | 3/2006 | Okita et al. | |
| 2006/0043436 A1 * | 3/2006 | Fan et al. | 257/290 |
| 2006/0043437 A1 | 3/2006 | Mouli | |
| 2006/0044434 A1 | 3/2006 | Okita et al. | |
| 2006/0175536 A1 | 8/2006 | Kim et al. | |
| 2006/0175641 A1 | 8/2006 | Mouli | |
| 2006/0197169 A1 | 9/2006 | Cole | |
| 2006/0208285 A1 | 9/2006 | Inoue et al. | |
| 2006/0214201 A1 | 9/2006 | Rhodes | |

FOREIGN PATENT DOCUMENTS

EP 1 530 239 A2 11/2005

OTHER PUBLICATIONS

International Search Report dated Jul. 7, 2008, for International Application No. PCT/US2008/054763 (5 pages).

* cited by examiner

*Primary Examiner*—John R Lee
(74) *Attorney, Agent, or Firm*—TraskBritt

(57) ABSTRACT

Methods, devices, and systems for an image sensor device are disclosed. An image sensor device comprises an array of image pixels wherein each pixel is configured for sensing light incident on the pixel. An image sensor device may further comprise a ground contact shared between at least two image pixels of the plurality. The ground contacts may be provided in an even pattern, a random pattern, or a repeating random pattern across the array. The image sensor device may further include an array of shared pixel structures comprising a plurality of pixels, wherein a ground contact may be evenly or randomly placed within each pixel structure across the array of pixel structures.

34 Claims, 7 Drawing Sheets

METHOD, APPARATUS, AND SYSTEM TO REDUCE GROUND RESISTANCE IN A PIXEL ARRAY

FIELD OF THE INVENTION

The present invention, in various embodiments, relates generally to an image sensor device and, more specifically, to a pixel array comprising a ground contact operably coupled thereto.

BACKGROUND OF THE INVENTION

An image sensor device is a semiconductor device with the capacity to convert an optical image into an electrical signal. Image sensor devices are used in a variety of imaging applications including medical products, navigational equipment, and consumer products such as digital cameras and cellular phones.

Many systems include image sensor devices to sense and capture optical images that can be electronically converted to a digital representation of the image. Image sensor devices include an array of photo-sensitive devices such as photo-diodes or photo-transistors fabricated on, for example, a complementary metal oxide semiconductor (CMOS) substrate. Each photo-sensitive device is sensitive to light in such a way that it can create an electrical charge that is proportional to the intensity of light striking the photo-sensitive device. The overall image captured by an image sensor device includes many pixels arranged in an array such that each pixel detects the light intensity at the location of that pixel.

Image sensor devices fabricated according to a conventional CMOS process are known as CMOS imagers and may be configured to include active pixel sensors (APS). An active pixel sensor (APS) includes an integrated circuit containing an array of pixels, each containing a photo detector (e.g., photodiode or other similar device) as well as other transistors for resetting and gating the stored charge on the photo detectors. In a conventional CMOS imager, each pixel cell in an array of pixels operates to convert light intensity to electrical charge, accumulate the electrical charge in proportion to the light intensity, and transfer the accumulated charge to an amplifier. In many CMOS imagers, a pixel may be reset to a specific reference voltage level prior to, or after, acquiring the image.

Conventional image sensor devices, in various configurations, may comprise a pixel array formed in a p-region over an n-type semiconductor substrate tied to a positive voltage or, alternatively, may comprise a p-region over an n-epi (epitaxial) or n-type implanted layer that is tied to a positive voltage and formed over a p-type substrate. One purpose of the aforementioned configurations is to provide for a barrier region to reduce dark current and cross-talk between adjacent pixels in a pixel array. An adverse side effect of utilizing an n-type substrate, or a p-type substrate with an n-epi or n-type implanted layer is that the pixel array lacks a substrate to act as a ground conductor and, therefore, the only ground conductor within the pixel array is the surface p-type region with a ground strap located on the outer edge of the pixel array. As a result, these conventional designs experience a large resistance drop on the ground plane from the edge of a pixel array to the center of the pixel array. Although these conventional designs have been successful in their intended function of decreasing dark current and cross-talk between adjacent pixels in the pixel array, they have increased the ground resistance of the pixel array.

FIGS. 1(a) and 1(b) illustrate an output response across a cross-section of a conventional image pixel array utilizing an n-substrate, or alternately, an n-epi or implanted n-type layer formed over a p-type substrate. Due to the increased ground resistance caused by the lack of a sufficient ground connection across the pixel array, pixels at the center of the array may display a lower response than pixels located at the edges of the array. Therefore, the output response across the pixel array may experience a dip 104 (dark spot in the image) in the center of the array as shown by FIG. 1(a). Alternatively, pixels at the center of the array may display a higher response than pixels located near the edges of the array, and therefore, the output response across the pixel array may experience a peak 102 (bright spot in the image) in the center of the array as shown by FIG. 1(b).

There is a need for methods, apparatuses, and systems to improve the quality of an image sensor device. Specifically, there is a need for improving the layout of a pixel array by maintaining electrical and optical isolation of adjacent pixels of a pixel array while providing a sufficient ground connection across the pixel array, and decreasing the ground resistance of the pixel array.

DETAILED DESCRIPTION OF THE INVENTION

Figure 1A:
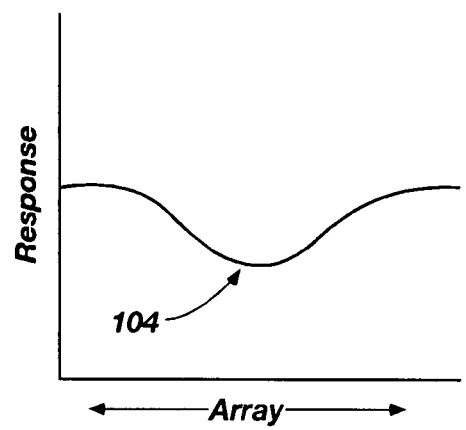
FIGS. 1(a) and 1(b) depict an output response across a cross-section of a conventional image sensor pixel array.
Figure 1B:
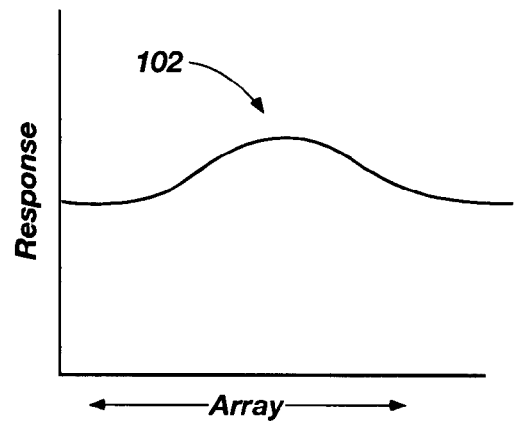

The present invention, in various embodiments, comprises methods, apparatuses, and systems for an image sensor device including an array of pixels and a ground contact shared by at least two pixels to reduce the ground resistance across a pixel array.

An embodiment of the invention includes an image sensor device that comprises a substrate and an array of image pixels. Each image pixel of the array is configured for sensing light incident on the image pixel and comprises a photosensitive area within a p-type region for accumulating photo-generated charges within the area. The image sensor device further comprises a plurality of ground contacts operably coupled to the p-type region, and at least some ground contacts shared between at least two image pixels of the array. In one embodiment, an n-type layer or region may reside between the substrate and the p-type region.

Another embodiment of the invention includes an electronic system comprising a processor-based device operably coupled to an image sensor device in accordance with an embodiment of the invention.

Another embodiment of the invention comprises a method of reducing ground resistance of an image pixel array. The method comprises providing a substrate and forming a p-type region on a surface of the substrate. The method further comprises forming an array of image pixels. Each image pixel comprises a photosensitive area within the p-type region for accumulating photo-generated charges within the photosensitive area. The method further includes forming a plurality of ground contacts operably coupled to the p-type region, wherein at least some ground contacts of the plurality are shared between at least two image pixels of the array. In one embodiment, an n-type layer or region may be formed between the substrate and the p-type region.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations, and the like, have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

In describing embodiments of the present invention, the systems and elements incorporating embodiments of the invention are described to facilitate a better understanding of the function of the described embodiments of the invention as it may be implemented within these systems and elements.

Figure 2:
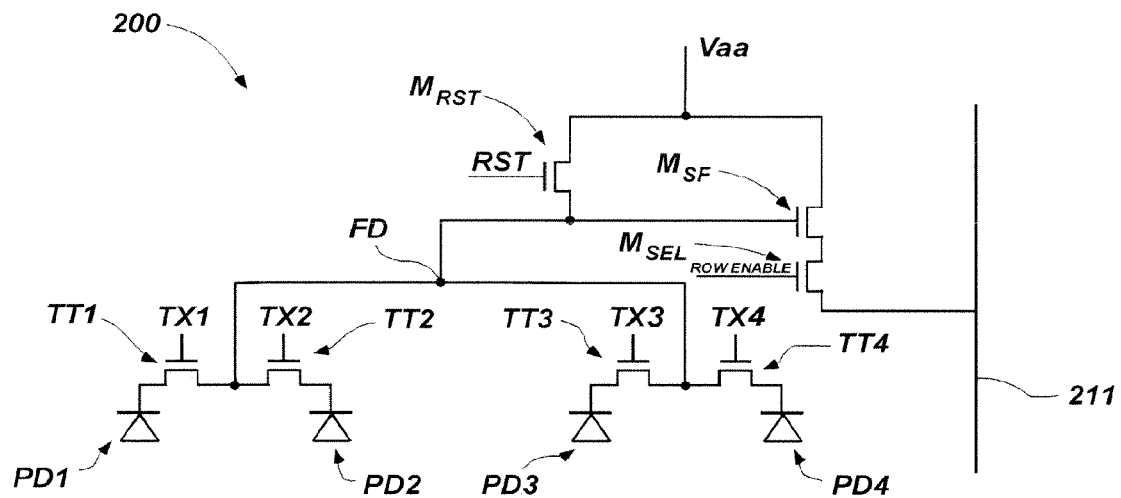
FIG. 2 is a circuit diagram of a pixel structure according to an embodiment of the invention.
Figure 3:
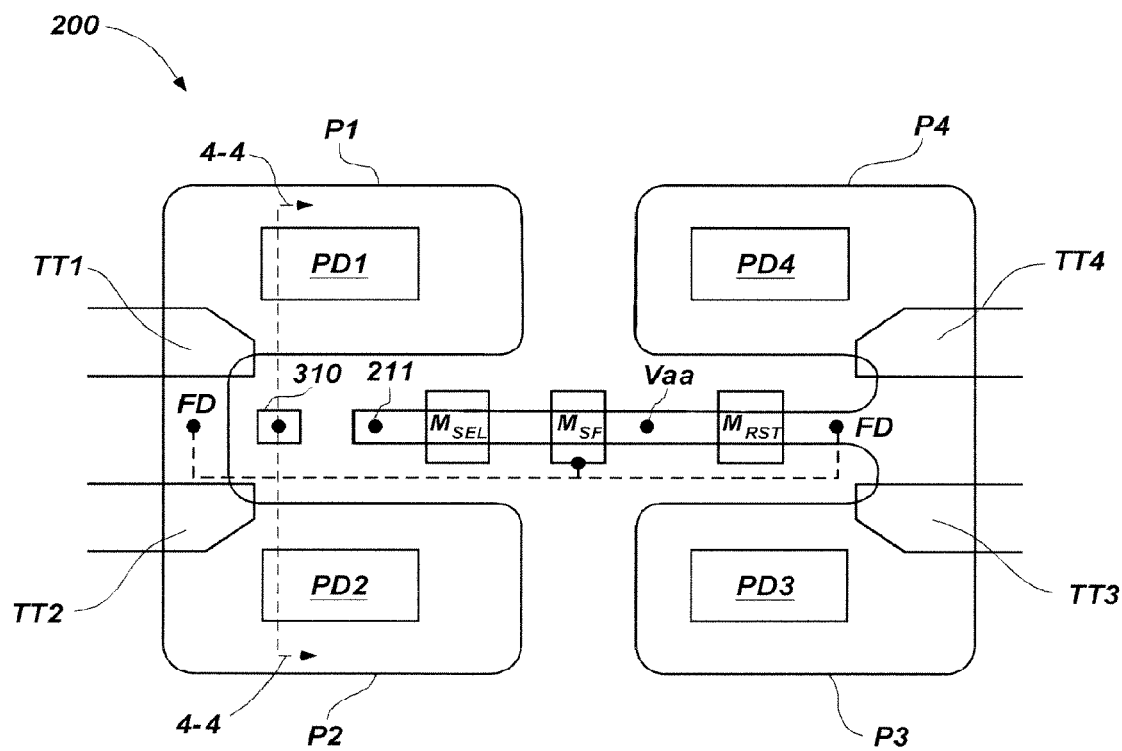
FIG. 3 is a top-view layout of a pixel structure in accordance with an embodiment of the invention.
Figure 4:
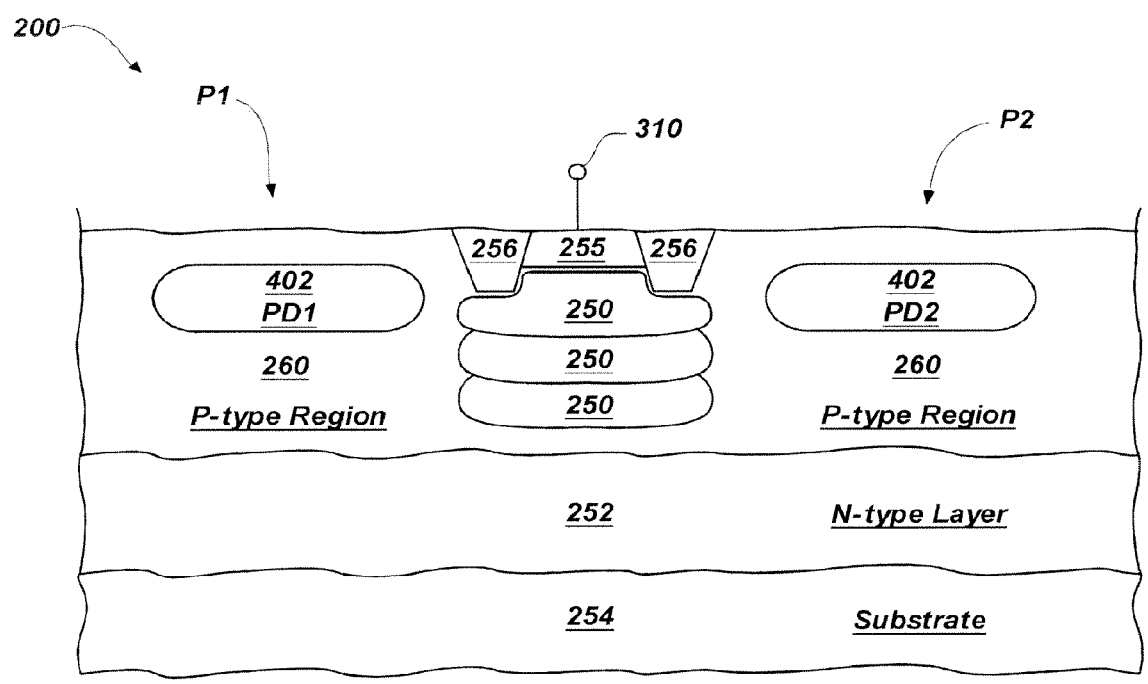
FIG. 4 is a cross-sectional view of a pixel structure according to an embodiment of the invention.
Figure 5:
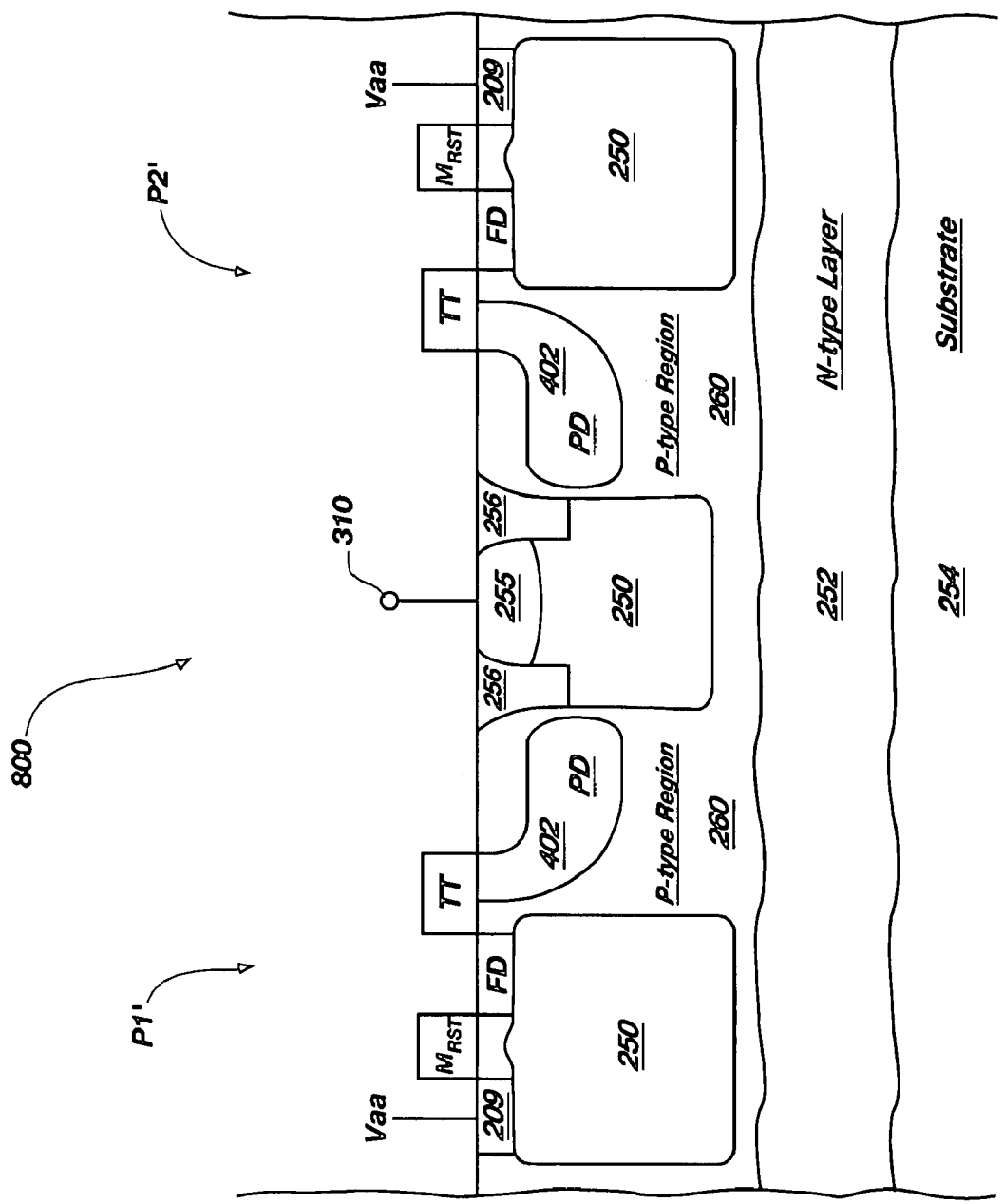
FIG. 5 is a cross-sectional view of adjacent image pixels according to an embodiment of the invention.

A pixel array may comprise an array of pixels wherein each pixel comprises its own set of control transistors (e.g., reset, source-follower, and row select), or a pixel array may comprise an array of pixels in a shared structure wherein a plurality of pixels in the array share a common set of control transistors in order to reduce the pixel size and enhance the fill factor of the pixel array. The fill factor corresponds to a ratio of an area occupied by the photo detectors of the array with respect to the overall area of the array. FIGS. 2, 3, and 4, described below, refer to an embodiment with such a shared structure. FIG. 5, described below, illustrates an embodiment wherein each pixel alone comprises a set of control resistors. As such, both embodiments are within the scope of the invention.

It should be noted that while an embodiment of the invention is described in relation to a four-transistor (4T) pixel of a CMOS image sensor device, embodiments of the invention also have applicability to other configurations and to other types of image sensor devices that feature pixel arrays. In addition, the term "pixel" or "pixel cell" refers to a picture element unit cell containing a photo detection device configured for converting electromagnetic radiation to an electrical signal.

FIG. 2 illustrates a circuit diagram of a portion of a pixel array in a shared pixel structure 200 located within an image sensor device. As described above, utilizing a shared structure within a pixel array will enhance the fill factor of the pixel array. Pixel structure 200, as illustrated, includes four pixels, each comprising a photo detector PD1, PD2, PD3, and PD4 configured for collecting photo-generated electrons. By way of example, and not limitation, photo detectors PD1, PD2, PD3, and PD4 may comprise a photo gate, photodiode, pinned photodiode, or the like. For brevity and ease of description and not by way of limitation, photo detectors PD1, PD2, PD3, and PD4 will hereinafter be referred to as photodiodes PD1, PD2, PD3, and PD4. Each photodiode PD1, PD2, PD3, and PD4 may be operably coupled to the source of a corresponding transfer transistor TT1, TT2, TT3, and TT4 configured for transferring a charge to an operably coupled floating diffusion region FD. As illustrated, the drains of transfer transistors TT1, TT2, TT3, and TT4 are operably coupled at the floating diffusion region FD. The gate of each transfer transistor TT1, TT2, TT3, and TT4 may be operably coupled to a corresponding transfer voltage TX1, TX2, TX3, and TX4 which may be asserted to turn on the corresponding transfer transistor and allow a charge to be transferred from the corresponding photodiode PD1, PD2, PD3, and PD4 to the operably coupled floating diffusion region FD. Consequently, when one transfer voltage is asserted, the remaining transfer voltages within pixel structure 200 are generally negated.

Floating diffusion region FD is configured for passing a charge to an operably coupled source-follower transistor $M_{SF}$. In addition, floating diffusion region FD is operably coupled to the source of a reset transistor $M_{RST}$, which is configured to reset the floating diffusion region FD to a predetermined voltage before a charge is transferred thereto from a photodiode. The drain of reset transistor $M_{RST}$ may be operably coupled to source supply voltage Vaa which may also be operably coupled to source-follower transistor $M_{SF}$. Reset transistor $M_{RST}$ may be controlled by a reset voltage RST which may be asserted to turn on reset transistor $M_{RST}$ and, as a result, reset the voltage at the floating diffusion region FD to a supply voltage Vaa.

Source-follower transistor $M_{SF}$ and row select transistor $M_{SEL}$ may be operably coupled in series with the source of row select transistor $M_{SEL}$ operably coupled to a column line output 211. The gate of row select transistor $M_{SEL}$ may be operably coupled to a row enable voltage ROW ENABLE which may be asserted to turn on row select transistor $M_{SEL}$, and allow a voltage on the source-follower transistor $M_{SF}$ to be passed to column line output 211. As described in greater detail below, pixel structure 200 may include a ground contact 310 (see FIGS. 3, 4, and 5) shared between at least two pixels and configured to provide a sufficient ground connection across a pixel array comprising pixel structure 200. Although pixel structure 200 as illustrated in FIG. 2 comprises four pixels, the embodiment of the invention is not limited to a four pixel structure but, rather, pixel structure 200 may comprise any number of pixels.

FIG. 3 illustrates a top-view layout of a pixel structure 200 within a pixel array of an image sensor device in accordance with an embodiment of the invention. As illustrated in FIG. 3, each pixel P1, P2, P3, and P4 may comprise a corresponding photodiode PD1, PD2, PD3, and PD4, each operably coupled to a corresponding transfer transistor TT1, TT2, TT3, and TT4. Photodiodes PD1, PD2, PD3, and PD4 share floating diffusion region FD, which is operably coupled to the gate of source-follower transistor $M_{SF}$. In addition, pixel structure 200 may include a reset transistor $M_{RST}$, row select transistor $M_{SEL}$, source supply voltage Vaa, column line output 211, and ground contact 310. Ground contact 310 may be shared by each pixel P1, P2, P3, and P4 within pixel structure 200 and is configured to provide a sufficient ground connection across a pixel array. Although pixel structure 200, as illustrated in FIG. 3, depicts ground contact 310 being located between photodiode PD1 and photodiode PD2, the embodiment of the invention is not so limiting, and ground contact 310 may be randomly placed between any photodiodes within pixel structure 200, such as between photodiode PD4 and photodiode PD3 or between photodiode PD2 and photodiode PD4. In addition, as described above, pixel structure 200 is not limited to a four pixel structure, but rather, may comprise any number of pixels.

FIG. 4 illustrates a cross-sectional view of the pixel structure 200 cutting along dashed line 4-4 shown in FIG. 3. Pixel structure 200 may comprise adjacent pixels P1, P2 including n-type charge collection regions 402 formed in a p-type region 260 and comprising photodiodes PD1 and PD2 configured for collecting charges generated by light incident thereto. For example only, and not by way of limitation, p-type region 260 may comprise a p-epi layer or an implanted region formed with a p-type dopant, such as boron. Substrate 254 may comprise a p-type substrate with an n-epi or an n-type layer 252 formed over substrate 254. By way of example, and not limitation, n-type layer 252 may comprise an implanted region formed with an n-type dopant, such as phosphorus, arsenic, or the like. In another embodiment, substrate 254 may comprise an n-type substrate in which case an n-epi or an n-type layer 252 may not be needed. Pixel structure 200 may also comprise an isolation region located between adjacent pixels P1 and P2 and comprising shallow trench isolations 256, p+ type region 255, and p-well layers 250. Shallow trench isolations 256 may be formed by etching trenches into p-type region 260 in order to provide a physical barrier between adjacent pixel cells, such as P1 and P2. Shallow trench isolations 256, along with p-well layers 250 and the n-epi or an n-type layer 252 are configured to isolate pixel cells electrically and optically from one another to reduce dark current and cross-talk between adjacent pixels. A ground contact 310 may be provided between adjacent pixels P1 and P2 and operably coupled to the p-type region 260 via an optional p+type region 255 which is formed between shallow trench isolations 256 and over p-well layers 250 and is configured to reduce contact resistance. As a result, ground contact 310 may be shared by surrounding pixels P1 and P2 (and pixels P3 and P4, not shown in cross-section; see FIG. 3), and therefore, may decrease the ground resistance across a pixel array by providing a sufficient ground connection across the pixel array comprising pixel structure 200. By sharing one ground contact between multiple pixels, as opposed to one ground contact per pixel, space is saved that may be allocated to the photosensitive area thereby improving the fill factor.

FIG. 5 illustrates a cross-sectional view of a portion of a pixel array 800 comprising two adjacent pixels P1' and P2' within an image sensor device, wherein the pixels do not share control transistors. Pixels P1', P2' each comprise a photodiode PD using an n-type charge collection region 402 operably coupled to a transfer transistor TT and configured for collecting charge generated by light incident on the pixel. The drain of each transfer transistor TT is operably coupled to a floating diffusion region FD, which is, in turn, operably coupled to a source of a reset transistor $M_{RST}$. The drain 209 of each reset transistor $M_{RST}$ is operably coupled to a source supply voltage Vaa. Similar to pixel structure 200 shown in FIG. 4, n-type charge collection regions 402 may be formed in a p-type region 260. In addition, substrate 254 may comprise a p-type substrate with an n-epi or an n-type layer 252 formed over substrate 254. In another embodiment, substrate 254 may comprise an n-type substrate, in which case the n-epi or an n-type layer 252 may not be needed. The portion of pixel array 800 may also comprise an isolation region located between adjacent pixels P1' and P2' and including shallow trench isolations 256, p+ type region 255 and p-well layer 250. P-well layer 250 may also be formed in the p-type region 260 under the floating diffusion regions FD and drain 209 of reset transistor $M_{RST}$ to form an isolation region between other pixels (not shown) adjacent pixels P1' and P2'. A ground contact 310 may be provided between adjacent pixels P1' and P2' and operably coupled to p-type region 260 via an optional p+type region 255 formed between shallow trench isolations 256 and over p-well layer 250. As a result, ground contact 310 may be shared by surrounding pixels P1' and P2' (and pixels P3' and P4', not shown in cross-section; see FIG. 3), and therefore, may decrease the ground resistance across pixel array 800 by providing a sufficient ground connection across pixel array 800.

Figure 6:
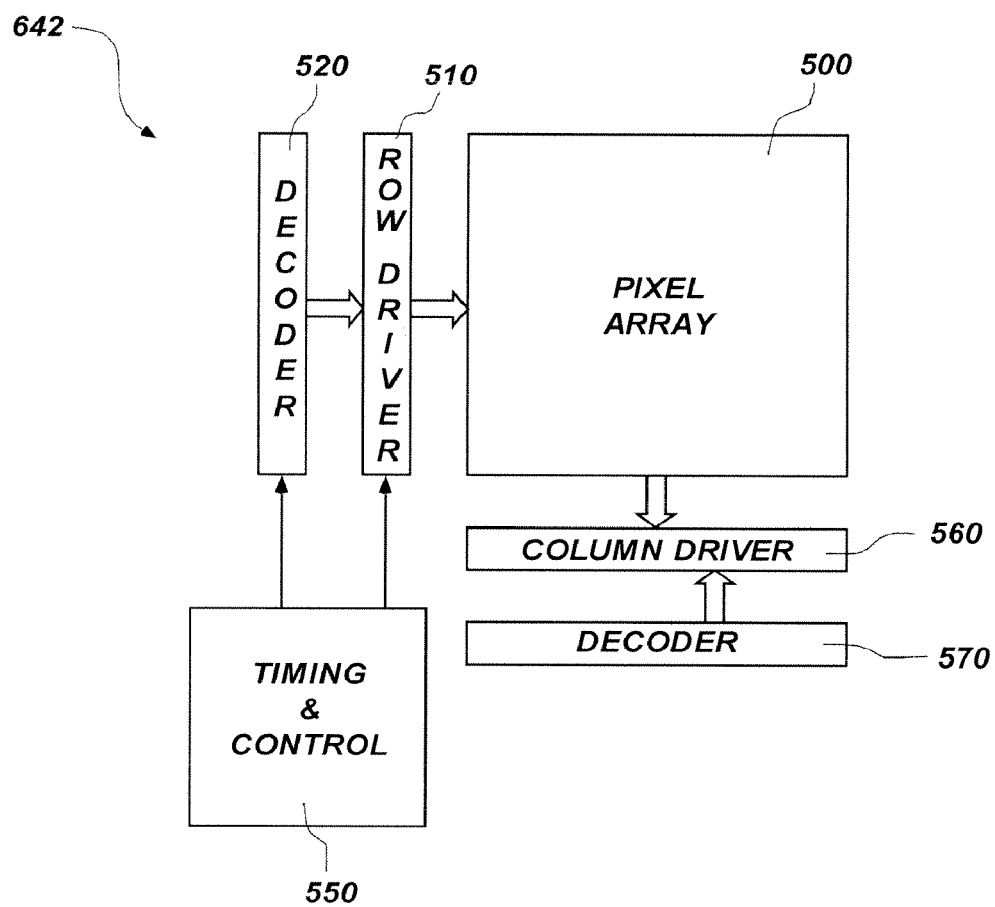
FIG. 6 is a block diagram of an image sensor device including a pixel array with pixels in accordance with an embodiment of the invention.

FIG. 6 is a block diagram for an image sensor device 642 having a pixel array 500 being constructed in accordance with an embodiment of the invention described above with reference to FIGS. 2, 3, 4, and 5. Pixel array 500 comprises a plurality of pixels arranged in a predetermined number of columns and rows. The pixels of each row in pixel array 500 are all turned on at the same time by a row select line and the pixels of each column are selectively output by a column select line. The row lines are selectively activated by the row driver 510 in response to row address decoder 520 and the column select lines are selectively activated by the column driver 560 in response to column address decoder 570. Therefore, a row and column address is provided for each pixel in pixel array 500. Image sensor device 642 is operated by a timing and control circuit 550 which controls address decoders 520, 570 for selecting the appropriated row and column lines for pixel readout, and row and column driver circuitry 510, 560 which apply driving voltage to the drive transistors of the selected row and column lines.

By way of example only, and not limitation, an image sensor device may include a pixel array 500 comprising 1,000,000 pixels and 250,000 evenly distributed ground contacts. Therefore, each ground contact may be shared by approximately four pixels. In another embodiment, in order to prevent any repeating pattern or structural aliasing, ground contacts may be randomly placed throughout a pixel array 500, and therefore, ground contacts across the array 500 may be shared by a varying number of pixels depending on the random placement of the ground contacts. In another example illustrated in FIG. 7(a), the number of ground contacts across pixel array 500 including a plurality of pixels P may vary in a repeatable random pattern. By example only, and not limitation, rows 1-3 of pixel array 500 may include a plurality of randomly distributed ground contacts (denoted by 'X'). This three-row pattern may then be repeated for the remaining rows of pixel array 500. As such, rows 4-6 may include the same number of ground contacts, with the same positioning, as rows 1-3. The examples described above are not intended to be limiting, and any even, calculated, or random distribution of the ground contacts across the pixel array 500 is within the scope of the embodiment of the invention.

Figure 7B:
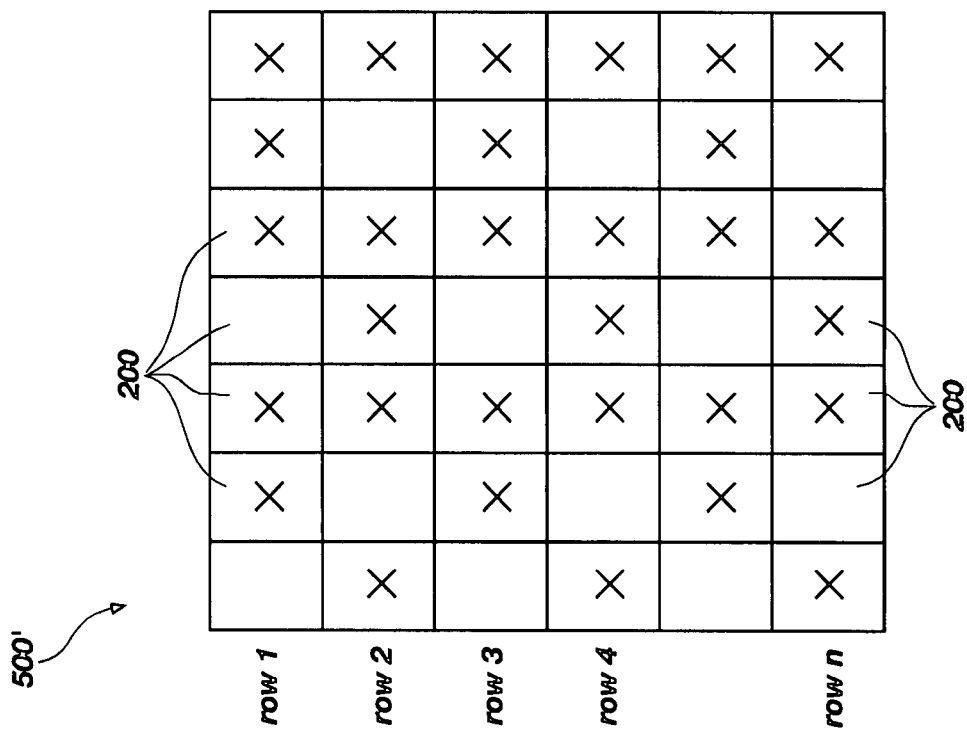
FIGS. 7(a) and 7(b) illustrate a portion of a pixel array including ground contacts in accordance with an embodiment of the invention.
Figure 7A:
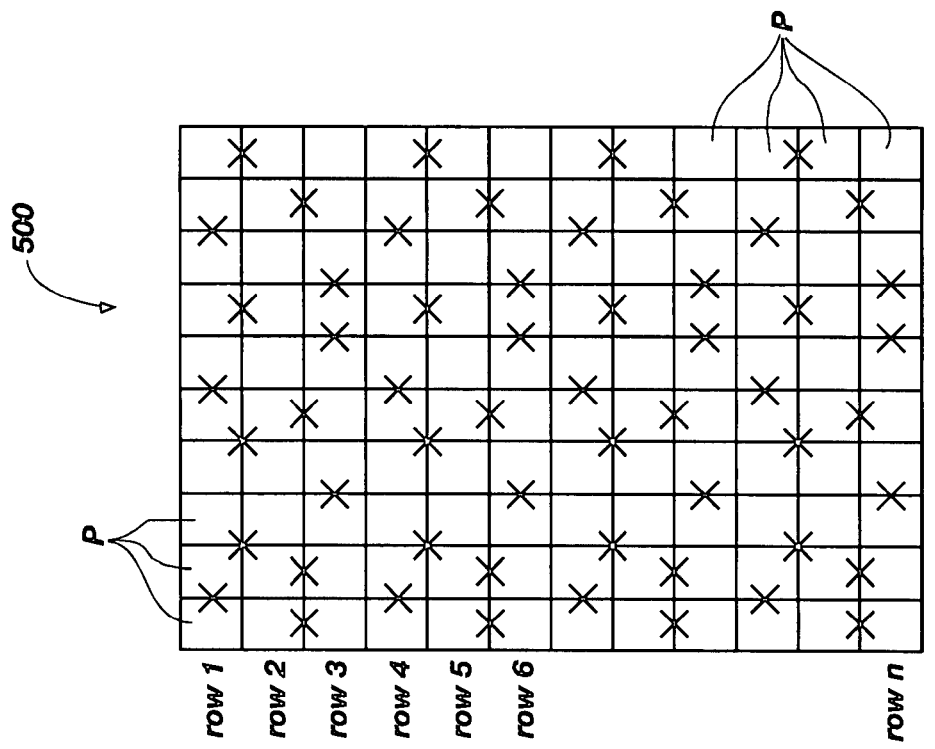

FIG. 7(b) illustrates a pixel structure array 500' including a plurality of pixel structures, such as pixel structure 200 described above in reference to FIGS. 2, 3, and 4. Ground contacts within the pixel structure array 500' may vary in a repeatable pattern throughout the array 500'. For example only, and not limitation, rows 1 and 2 of pixel structure array 500' may include a plurality of randomly distributed ground contacts (denoted by 'X'). This two-row structure pattern may then be repeated for the remainder of the pixel structure array 500'. As such, rows 3 and 4 may include the same number of ground contacts, with the same positioning, as rows 1 and 2. The examples described above are not intended to be limiting, and any even, calculated, or random distribution of the ground contacts within pixel structure array 500' is within the scope of the embodiment of the invention.

Figure 8:
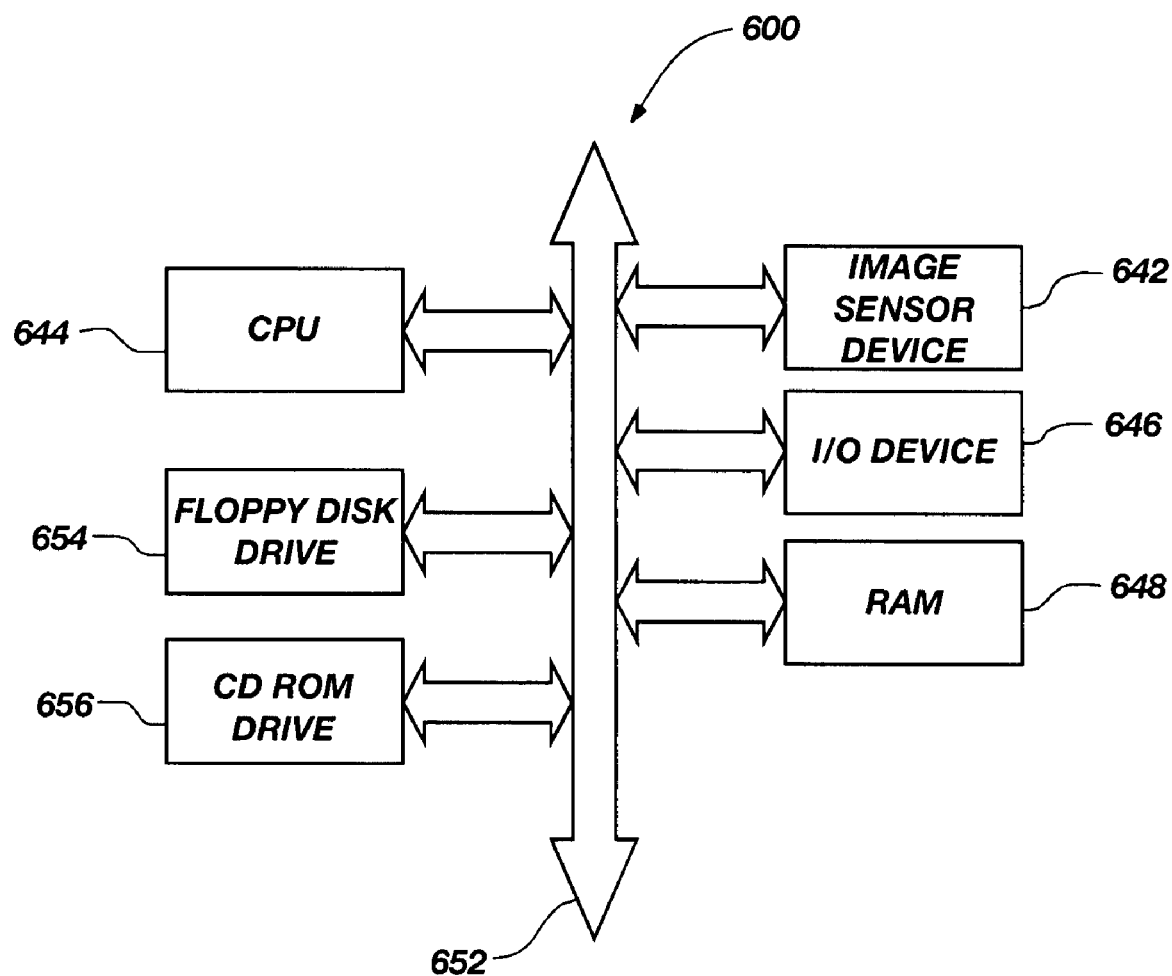
FIG. 8 is an illustration of a system including an image sensor device according to an embodiment of the invention.

A processor-based system 600 which includes an image sensor device 642 in accordance with an embodiment of the present invention is illustrated in FIG. 8. Without being limiting, such a system 600 may include a computer system, camera system, scanner, machine vision system, vehicle navigation system, video phone, surveillance system, auto focus system, star tracker system, motion detection system, image stabilization system, each of which may be configured to utilize an embodiment of the present invention.

A processor-based system 600, such as a computer system, for example, generally comprises a central processing unit (CPU) 644, for example, a microprocessor that may communicate with an input/output (I/O) device 646 over a bus 652. The image sensor device 642 may also communicate with the system 600 over bus 652. The system 600 also includes random access memory (RAM) 648, and, in the case of a computer system, may include peripheral devices such as a floppy disk drive 654 and a compact disk (CD) ROM drive 656 which also communicate with CPU 644 over bus 652. Floppy disk drive 654, image sensor device 642 and memory 648 may be integrated on a single IC chip.

Specific embodiments have been shown by way of example in the drawings and have been described in detail herein; however, the invention may be susceptible to various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. An image sensor device, comprising:
  a substrate;
  an array of image pixels, each image pixel of the array configured for sensing light incident on the pixel, wherein each image pixel of the array comprises a photosensitive area within a p-type region for accumulating photo-generated charges within the photosensitive area, wherein the p-type region is formed on the substrate; and
  a plurality of ground contacts operably coupled to the p-type region, wherein at least some ground contacts of the plurality are shared between at least two image pixels of the array.

2. The image sensor device of claim 1, further comprising an n-type layer formed between the substrate and the p-type region.

3. The image sensor device of claim 2, wherein the n-type layer comprises at least one of an n-epi (epitaxial) layer and an implanted region formed with an n-type dopant.

4. The image sensor device of claim 3, wherein the n-type dopant comprises at least one of phosphorus and arsenic.

5. The image sensor device of claim 1, wherein the plurality of ground contacts are distributed across the array in at least one of an even pattern, a random pattern, and a repeating random pattern.

6. The image sensor device of claim 1, wherein the at least one ground contact is formed over an isolation region in the p-type region, wherein the isolation region provides the operable coupling from the plurality of ground contacts to the p-type region.

7. The image sensor device of claim 6, wherein the isolation region comprises at least one of a shallow trench isolation, a p-well layer, and a p+type region.

8. The image sensor device of claim 1, wherein the substrate comprises at least one of a p-type substrate and an n-type substrate.

9. The image sensor device of claim 1, wherein the p-type region comprises at least one of a p-epi (epitaxial) layer and an implanted region formed with a p-type dopant.

10. The image sensor device of claim 9, wherein the p-type dopant comprises boron.

11. The image sensor device of claim 1, wherein the array of image pixels comprises a plurality of image pixel structures each comprising a plurality of image pixels of the array, wherein each image pixel structure of the plurality is configured to receive a ground contact of the plurality.

12. The image sensor device of claim 11, wherein the plurality of image pixel structures receive the ground contact in at least one of an even pattern, a random pattern, and a repeating random pattern.

13. An electronic system, comprising:
  a processor-based device; and
  an image sensor device operably coupled to the processor-based device and comprising:
    a substrate;
    an array of image pixels, each image pixel of the array configured for sensing light incident on the pixel, wherein each image pixel of the array comprises a photosensitive area within a p-type region for accumulating photo-generated charges within the photosensitive area, wherein the p-type region is formed on the substrate; and
    a plurality of ground contacts operably coupled to the p-type region, wherein at least some ground contacts of the plurality are shared between at least two image pixels of the array.

14. The electronic system of claim 13, further comprising an n-type layer formed between the substrate and the p-type region.

15. The electronic system of claim 14, wherein the n-type layer comprises at least one of an n-epi (epitaxial) layer and an implanted region formed with an n-type dopant.

16. The electronic system of claim 15, wherein the n-type dopant comprises at least one of phosphorus and arsenic.

17. The electronic system of claim 13, wherein the plurality of ground contacts are distributed across the array in at least one of an even pattern, a random pattern, and a repeating random pattern.

18. The electronic system of claim 13, wherein the at least one ground contact is formed over an isolation region in the p-type region, wherein the isolation region provides the operable coupling from the plurality of ground contacts to the p-type region.

19. The electronic system of claim 18, wherein the isolation region comprises at least one of a shallow trench isolation, a p-well layer, and a p+type region.

20. The electronic system of claim 13, wherein the substrate comprises at least one of a p-type substrate and an n-type substrate.

21. The electronic system of claim 13, wherein the p-type region comprises at least one of a p-epi (epitaxial) layer and an implanted region formed with a p-type dopant.

22. The electronic system of claim 21, wherein the p-type dopant comprises boron.

23. The electronic system of claim 13, wherein the array of image pixels comprises a plurality of image pixel structures each comprising a plurality of image pixels of the array, wherein each image pixel structure of the plurality is configured to receive a ground contact of the plurality.

24. The electronic system of claim 23, wherein the plurality of image pixel structures receive the ground contact in at least one of an even pattern, a random pattern, and a repeating random pattern.

25. A method of providing reduced ground resistance in an image pixel array, comprising:
   providing a substrate;
   forming a p-type region on the substrate;
   forming an array of image pixels, wherein each image pixel comprises a photosensitive area within the p-type region for accumulating photo-generated charges within the photosensitive area; and
   forming a plurality of ground contacts operably coupled to the p-type region, wherein at least some ground contacts of the plurality are shared between at least two image pixels of the array.

26. The method of claim 25, further comprising forming an n-type layer between the substrate and the p-type region.

27. The method of claim 26, wherein forming an n-type layer comprises forming at least one of an n-epi (epitaxial) region and an implanted region formed with an n-type dopant.

28. The method of claim 25, wherein forming the plurality of ground contacts comprises forming a plurality of ground contacts across the array in at least one of an even pattern, a random pattern, and a repeating random pattern.

29. The method of claim 25, wherein forming the plurality of ground contacts comprises forming the plurality of ground contacts operably coupled above at least one isolation region.

30. The method of claim 25, wherein providing a substrate comprises providing at least one of a p-type substrate and an n-type substrate.

31. The method of claim 25, wherein forming a p-type region comprises forming at least one of a p-epi (epitaxial) region and an implanted region formed with a p-type dopant.

32. The method of claim 25, wherein forming an array of image pixels comprises forming a plurality of image pixel structures each comprising a plurality of image pixels of the array and configured to receive a ground contact.

33. The method of claim 32, further comprising distributing the plurality of ground contacts in at least one of an even pattern, a random pattern, and a repeating random pattern within the plurality of image pixel structures.

34. A method of reducing ground resistance of an image pixel array comprising a substrate having a p-type region on the substrate having an array of image pixels each comprising a photosensitive area within the p-type region, the method comprising:
   grounding the p-type region during operation of the image pixel array using a plurality of ground contacts, at least some of which ground contacts are shared between at least two image pixels of the array.

* * * * *